US012609684B2

(12) United States Patent
Kwon et al.

(10) Patent No.: US 12,609,684 B2
(45) Date of Patent: Apr. 21, 2026

(54) PHASE MIXER CIRCUIT, A PHASE MIXING METHOD, AND A CLOCK GENERATION CIRCUIT AND A SEMICONDUCTOR APPARATUS

(71) Applicant: SK hynix Inc., Icheon-si (KR)

(72) Inventors: Soon Chul Kwon, Icheon-si (KR); Min Chang Kim, Icheon-si (KR); Seul Gi Kim, Icheon-si (KR); Hong Joo Song, Icheon-si (KR); Ic Su Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 24 days.

(21) Appl. No.: 18/597,637

(22) Filed: Mar. 6, 2024

(65) Prior Publication Data

US 2025/0125795 A1    Apr. 17, 2025

(51) Int. Cl.
 *H03K 5/02* (2006.01)
 *H03K 3/037* (2006.01)
 *H03K 5/135* (2006.01)
 *H03K 5/00* (2006.01)

(52) U.S. Cl.
 CPC ............. *H03K 5/023* (2013.01); *H03K 3/037* (2013.01); *H03K 5/135* (2013.01); *H03K 2005/00052* (2013.01)

(58) Field of Classification Search
 None
 See application file for complete search history.

(56) References Cited

U.S. PATENT DOCUMENTS

| | | | |
|---|---|---|---|
| 8,901,981 B2 * | 12/2014 | Park | H03K 5/131 327/276 |
| 10,171,091 B2 | 1/2019 | Song et al. | |
| 11,398,816 B2 | 7/2022 | Satoh | |
| 11,742,017 B2 * | 8/2023 | Satoh | H03L 7/0814 327/241 |

FOREIGN PATENT DOCUMENTS

KR         100639229 B1    10/2006

* cited by examiner

*Primary Examiner* — Cassandra F Cox
(74) *Attorney, Agent, or Firm* — WILLIAM PARK AND ASSOCIATES LTD.

(57) ABSTRACT

A phase mixer circuit is configured to receive a first input clock signal and a second input clock signal, and to generate an intermediate clock signal having an intermediate phase between phases of the first and second input clock signals. The phase mixer circuit is configured to determine a logic value of a mixed code signal, and to generate an output clock signal by mixing one of the first and second input clock signals and the intermediate clock signal.

21 Claims, 11 Drawing Sheets

<u>121</u>

FIG. 5
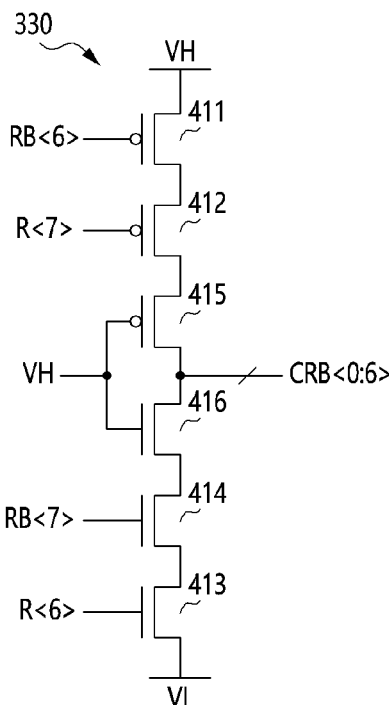
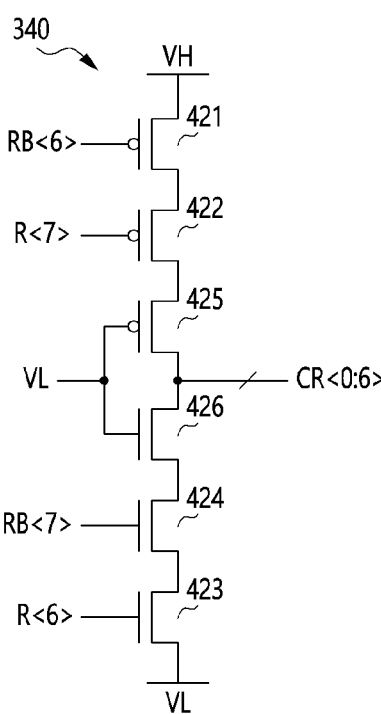

FIG. 6

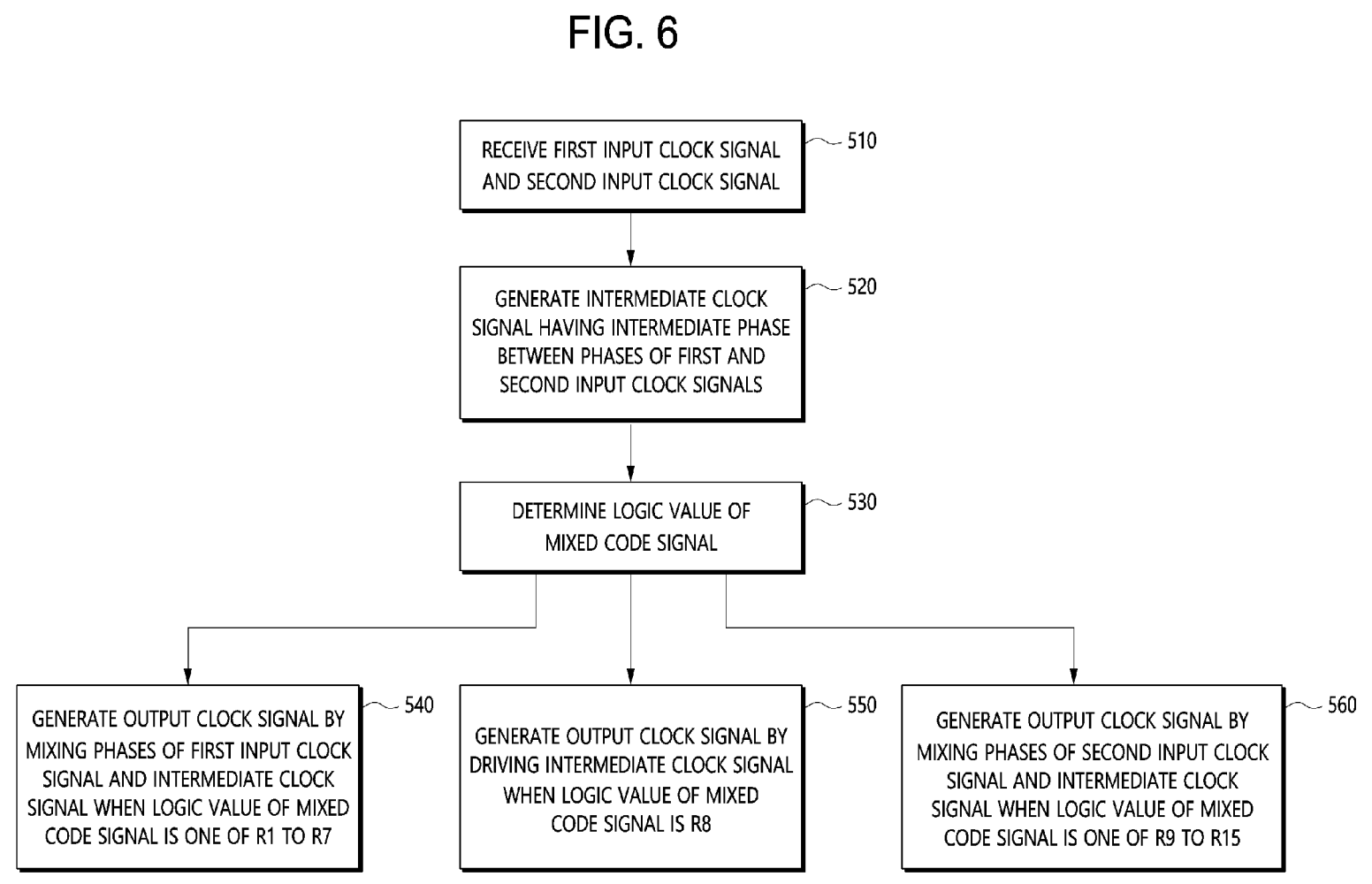

510 — RECEIVE FIRST INPUT CLOCK SIGNAL AND SECOND INPUT CLOCK SIGNAL

520 — GENERATE INTERMEDIATE CLOCK SIGNAL HAVING INTERMEDIATE PHASE BETWEEN PHASES OF FIRST AND SECOND INPUT CLOCK SIGNALS

530 — DETERMINE LOGIC VALUE OF MIXED CODE SIGNAL

540 — GENERATE OUTPUT CLOCK SIGNAL BY MIXING PHASES OF FIRST INPUT CLOCK SIGNAL AND INTERMEDIATE CLOCK SIGNAL WHEN LOGIC VALUE OF MIXED CODE SIGNAL IS ONE OF R1 TO R7

550 — GENERATE OUTPUT CLOCK SIGNAL BY DRIVING INTERMEDIATE CLOCK SIGNAL WHEN LOGIC VALUE OF MIXED CODE SIGNAL IS R8

560 — GENERATE OUTPUT CLOCK SIGNAL BY MIXING PHASES OF SECOND INPUT CLOCK SIGNAL AND INTERMEDIATE CLOCK SIGNAL WHEN LOGIC VALUE OF MIXED CODE SIGNAL IS ONE OF R9 TO R15

PHASE MIXER CIRCUIT, A PHASE MIXING METHOD, AND A CLOCK GENERATION CIRCUIT AND A SEMICONDUCTOR APPARATUS

CROSS-REFERENCES TO RELATED APPLICATION

The present application claims priority under 35 U.S.C. § 119(a) to Korean application number 10-2023-0136455, filed on Oct. 13, 2023, in the Korean Intellectual Property Office, which is incorporated herein by reference in its entirety.

BACKGROUND

1. Technical Field

The present disclosure relates to an integrated circuit technology, and more particularly, to a phase mixer circuit, a phase mixing method, and a clock generation circuit and a semiconductor apparatus.

2. Related Art

Electronic devices may include many electronic components, and among the electronic devices, a computer system may include many semiconductor apparatuses made of semiconductors. The semiconductor apparatuses constituting the computer system may communicate with each other by transmitting and receiving a system clock signal such as an external clock signal and data. The semiconductor apparatuses may operate in synchronization with a clock signal. The semiconductor apparatus may generate an internal clock signal from the system clock signal in order to match the operation timing with an external device or secure an operation margin, and include a clock generation circuit for generating the internal clock signal.

The clock generation circuit may generate the internal clock signal by changing a phase of the system clock signal or dividing a frequency of the system clock signal. The clock generation circuit may generate a plurality of internal clock signals having mutually different phases. The clock generation circuit may generate the plurality of internal clock signals having a target phase by mixing phases of source clock signals. The clock generation circuit may determine a mixing ratio of the phases of the source clock signals according to a value of a mixed code signal. In such a case, as the phase changes linearly according to changes in the value of the mixed code signal, the clock generation circuit may generate the internal clock signal having an accurate phase.

SUMMARY

In accordance with an embodiment, a phase mixer circuit may include an intermediate clock generation circuit and a mixing circuit. The intermediate clock generation circuit may be configured to generate an intermediate clock signal having an intermediate phase between phases of a first input clock signal and a second input clock signal. The mixing circuit may be configured to generate an output clock signal by mixing the phase of the first input clock signal and the phase of the intermediate clock signal when a target phase is close to the phase of the first input clock signal, and to generate the output clock signal by mixing the phase of the second input clock signal and the phase of the intermediate clock signal when the target phase is close to the phase of the second input clock signal.

In accordance with an embodiment, a phase mixing method may include receiving a first input clock signal and a second input clock signal. The method may include generating an intermediate clock signal having an intermediate phase between phases of the first and second input clock signals. The method may include determining a logic value of a mixed code signal. And the method may include generating an output clock signal by mixing the phase of one of the first input clock signal and the second input clock signal and the phase of the intermediate clock signal based on a result of the determination of the logic value of the mixed code signal and the mixed code signal.

In accordance with an embodiment, a phase mixer circuit may include a phase clock generation circuit and a mixing circuit. The phase clock generation circuit may be configured to generate a first phase clock signal by delaying a first input clock signal, to generate a second phase clock signal by delaying a second input clock signal, and to generate a third phase clock signal having an intermediate phase between phases of the first and second phase clock signals. The mixing circuit may be configured to generate an output clock signal by mixing the phase of the first phase clock signal and the phase of the third phase clock signal when logic values of a mixed code signal are first to $n^{th}$ values, to generate the output clock signal by driving the third phase clock signal when the logic value of the mixed code signal is an $n+1^{th}$ value, and to generate the output clock signal by mixing the phase of the second phase clock signal and the phase of the third phase clock signal when the logic values of the mixed code signal are $n+2^{th}$ to $2n+1^{th}$ values. 'n' may be an integer of 2 or more.

BRIEF DESCRIPTION OF THE DRAWINGS

FIG. 5 is a diagram illustrating configurations of embodiments of a first setting circuit and a second setting circuit illustrated in FIG. 4.

FIG. 6 is a flowchart showing a phase mixing method of the phase mixer circuit in accordance with an embodiment.

FIG. 8 is a diagram illustrating a configuration of a phase mixer circuit in accordance with an embodiment.

DETAILED DESCRIPTION

Figure 1:
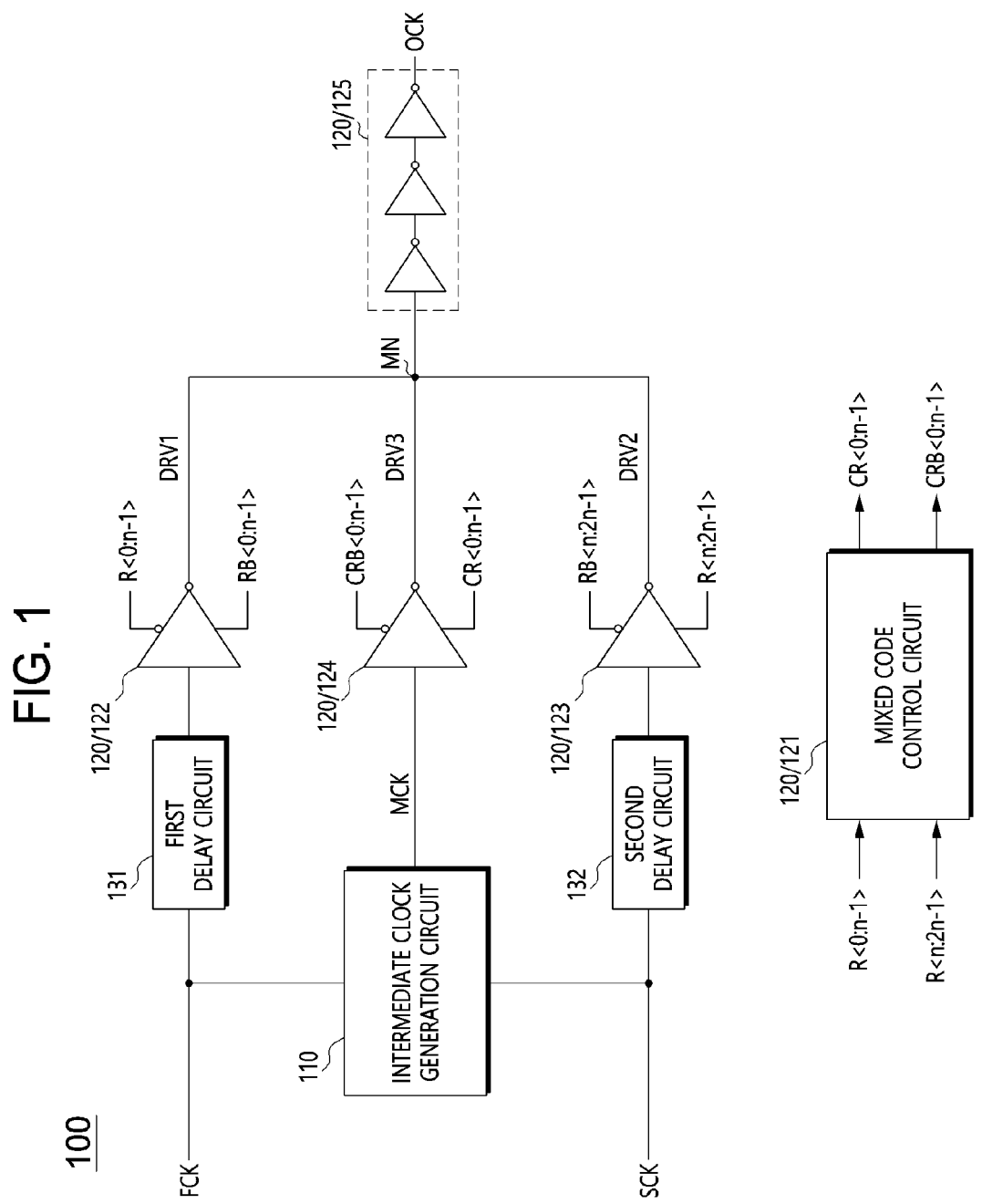
FIG. 1 is a diagram illustrating a configuration of a phase mixer circuit in accordance with an embodiment.

FIG. 1 is a diagram illustrating a configuration of a phase mixer circuit 100 in accordance with an embodiment. Referring to FIG. 1, the phase mixer circuit 100 may receive a first input clock signal FCK and a second input clock signal SCK and generate an output clock signal OCK. The first input clock signal FCK may have a phase that leads the phase of the second input clock signal SCK. The phase mixer circuit 100 may generate the output clock signal OCK having a phase between the phases of the first and second input clock signals FCK and SCK by mixing the phases of the first and second input clock signals FCK and SCK. The phase mixer circuit 100 may receive a mixed code signal R<0:2n-1>, and determine a phase mixing ratio of the first and second input clocks signals FCK and SCK based on the mixed code signal R<0:2n-1>. Depending on the phase mixing ratio, the phase of the output clock signal OCK may be changed from the phase of the first input clock signal FCK to the phase of the second input clock signal SCK. The mixed code signal R<0:2n-1> may include a plurality of bits, and a logic value of the mixed code signal R<0:2n-1> may be changed like, for example, a thermometer code.

The mixed code signal R<0:2n-1> may include 2n bits and have 2n+1 logic values. Here, n may be an integer of 2 or more. The phase mixer circuit 100 may adjust the phase mixing ratio of the first input clock signal FCK based on at least some bits of the mixed code signal R<0:2n-1>, and adjust the phase mixing ratio of the second input clock signal SCK based on the remaining bits of the mixed code signal R<0:2n-1>. For example, first to $n^{th}$ bits R<0:n-1> of the mixed code signal may be used to adjust the phase mixing ratio of the first input clock signal FCK, and $n+1^{th}$ to $2n^{th}$ bits R<n:2n-1> of the mixed code signal may be used to adjust the phase mixing ratio of the second input clock signal SCK. Hereinafter, the first to $n^{th}$ bits R<0:n-1> of the mixed code signal may be referred to as a first mixed code signal, and the $n+1^{th}$ to $2n-1^{th}$ bits R<n:2n-1> of the mixed code signal may be referred to as a second mixed code signal. The first bit R<0> of the mixed code signal may be the least significant bit of the first mixed code signal R<0:n-1>, and the $n^{th}$ bit R<n-1> of the mixed code signal may be the most significant bit of the first mixed code signal R<0:n-1>. The $n+1^{th}$ bit R<n> of the mixed code signal may be the least significant bit of the second mixed code signal R<n:2n-1>, and the $2n^{th}$ bit R<2n-1> of the mixed code signal may be the most significant bit of the second mixed code signal R<n:2n-1>.

The phase mixer circuit 100 may generate an intermediate clock signal MCK based on the first input clock signal FCK and the second input clock signal SCK. The phase mixer circuit 100 may generate the intermediate clock signal MCK having an intermediate phase between the phases of the first and second input clock signals FCK and SCK. The phase mixer circuit 100 may generate the output clock signal OCK by mixing the phase of one of the first and second input clock signals FCK and SCK and the phase of the intermediate clock signal MCK based on the mixed code signal R<0:2n-1>. In an embodiment, the phase mixer circuit 100 may improve the linearity of a phase change amount of the output clock signal OCK by mixing the phases of the first input clock signal FCK and the intermediate clock signal MCK or mixing the phases of the second input clock signal SCK and the intermediate clock signal MCK.

The phase mixer circuit 100 may include an intermediate clock generation circuit 110 and a mixing circuit 120. The intermediate clock generation circuit 110 may receive the first input clock signal FCK and the second input clock signal SCK. The intermediate clock generation circuit 110 may generate the intermediate clock signal MCK based on the first and second input clock signals FCK and SCK. The intermediate clock generation circuit 110 may generate the intermediate clock signal MCK having an intermediate phase between the phases of the first and second input clock signals FCK and SCK by mixing the phases of the first and second input clock signals FCK and SCK. The intermediate clock generation circuit 110 may generate the intermediate clock signal MCK by mixing the phases of the first and second input clock signals FCK and SCK at, for example, a one-to-one ratio. In an embodiment, the intermediate clock generation circuit 110 may also generate the intermediate clock signal MCK by mixing the phases of the first and second input clock signals FCK and SCK at a ratio other than the one-to-one ratio.

The mixing circuit 120 may receive the first input clock signal FCK, the second input clock signal SCK, the intermediate clock signal MCK, and the mixed code signal R<0:2n-1>, and generate the output clock signal OCK based on the first input clock signal FCK, the second input clock signal SCK, the intermediate clock signal MCK, and the mixed code signal R<0:2n-1>. The mixing circuit 120 may generate the output clock signal OCK by mixing one of the first input clock signal FCK and the second input clock signal SCK and the intermediate clock signal MCK based on the mixed code signal R<0:2n-1>. When a target phase is close to the phase of the first input clock signal FCK, the mixing circuit 120 may generate the output clock signal OCK by mixing the phases of the first input clock signal FCK and the intermediate clock signal MCK. When the target phase is close to the phase of the second input clock signal SCK, the mixing circuit 120 may generate the output clock signal OCK by mixing the phases of the second input clock signal SCK and the intermediate clock signal MCK. The target phase may be a phase of the output clock signal OCK to be generated by the phase mixer circuit 100 based on the mixed code signal R<0:2n-1>. Based on the mixed code signal R<0:2n-1>, the mixing circuit 120 may select a clock signal to be mixed with the intermediate clock signal MCK from the first and second input clock signals FCK and SCK. The logic value of the mixed code signal R<0:2n-1> may include information on the target phase that the output clock signal OCK needs to have. For example, any one logic value among the logic values which the mixed code signal R<0:2n-1> can have may be used to the information on the target phase. The mixing circuit 120 may determine the logic value of the mixed code signal R<0:2n-1>, and mix one of the first and second input clock signals FCK and SCK and the intermediate clock signal MCK according to the determination result.

Figure 2:
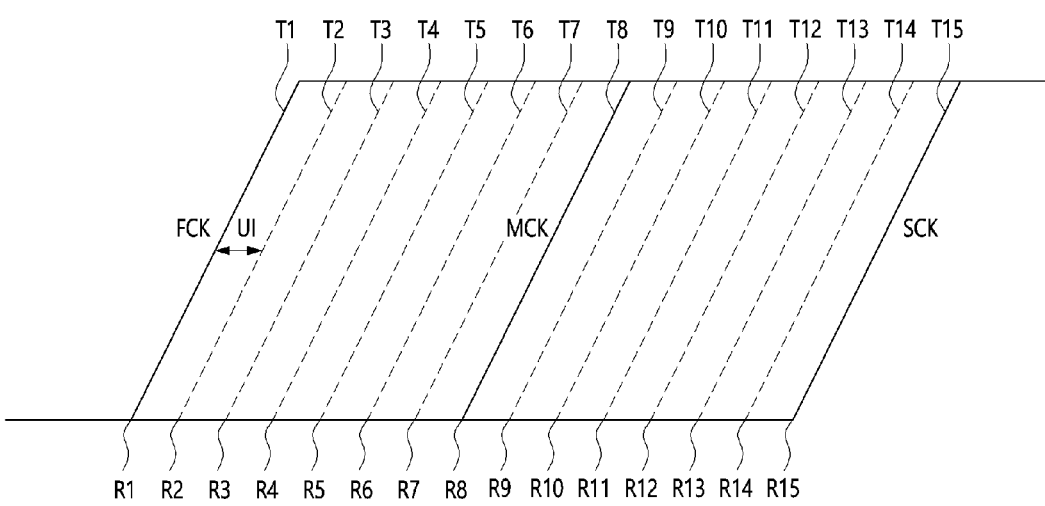
FIG. 2 is a waveform diagram illustrating clock signals used in the phase mixer circuit in accordance with an embodiment and target phases corresponding to logic values of a mixed code signal.

FIG. 2 is a waveform diagram illustrating the clock signals FCK, SCK and MCK used in the phase mixer circuit 100 in accordance with an embodiment and target phases corresponding to the logic values of the mixed code signal R<0:2n-1>. Referring to FIG. 2, the first input clock signal FCK may have a relatively leading phase, and the second input clock signal SCK may have a relatively lagging phase. The intermediate clock signal MCK may have an intermediate phase between the phases of the first input clock signal FCK and the second input clock signal SCK. For clarity of explanation, it is assumed that n is 7 and the mixed code signal R<0:2n−1> may include 14 bits. The mixed code signal R<0:2n−1> may have 15 logic values R1 to R15. As the logic values of the mixed code signal R<0:2n−1> increase step by step, target phases T1 to T15 may be changed step by step.

When the mixed code signal R<0:2n−1> has a first value R1, the target phase T1 may substantially coincide with the phase of the first input clock signal FCK. When the mixed code signal R<0:2n−1> has a second value R2, the target phase T2 may be a phase that lags the phase of the first input clock signal FCK by a mixed unit phase UI. When the mixed code signal R<0:2n−1> has a third value R3, the target phase T3 may be a phase that lags the phase of the first input clock signal FCK by twice the mixed unit phase UI. When the mixed code signal R<0:2n−1> has a fourth value R4, the target phase T4 may be a phase that lags the phase of the first input clock signal FCK by three times the mixed unit phase UI. When the mixed code signal R<0:2n−1> has a fifth value R5, the target phase T5 may be a phase that lags the phase of the first input clock signal FCK by four times the mixed unit phase UI. When the mixed code signal R<0:2n−1> has a sixth value R6, the target phase T6 may be a phase that lags the phase of the first input clock signal FCK by five times the mixed unit phase UI. When the mixed code signal R<0:2n−1> has a seventh value R7, the target phase T7 may be a phase that lags the phase of the first input clock signal FCK by six times the mixed unit phase UI. When the mixed code signal R<0:2n−1> has an eighth value R8, the target phase T8 may substantially coincide with the phase of the intermediate clock signal MCK.

When the mixed code signal R<0:2n−1> has a ninth value R9, the target phase T9 may be a phase that leads the phase of the second input clock signal SCK by six times the mixed unit phase UI. When the mixed code signal R<0:2n−1> has a tenth value R10, the target phase T10 may be a phase that leads the phase of the second input clock signal SCK by five times the mixed unit phase UI. When the mixed code signal R<0:2n−1> has an eleventh value R11, the target phase T11 may be a phase that leads the phase of the second input clock signal SCK by four times the mixed unit phase UI. When the mixed code signal R<0:2n−1> has a twelfth value R12, the target phase T12 may be a phase that leads the phase of the second input clock signal SCK by three times the mixed unit phase UI. When the mixed code signal R<0:2n−1> has a thirteenth value R13, the target phase T13 may be a phase that leads the phase of the second input clock signal SCK by twice the mixed unit phase UI. When the mixed code signal R<0:2n−1> has a fourteenth value R14, the target phase T14 may be a phase that leads the phase of the second input clock signal SCK by the mixed unit phase UI. When the mixed code signal R<0:2n−1> has a fifteenth value R15, the target phase T15 may be a phase that substantially coincide with the phase of the second input clock signal SCK. When the logic values of the mixed code signal R<0:2n−1> are the first to seventh values R1 to R7, the target phases T1 to T7 may be closer to the phase of the first input clock signal FCK than the phase of the second input clock signal SCK. When the logic values of the mixed code signal R<0:2n−1> are the ninth to fifteenth value R9 to R15, the target phases T9 to T15 may be closer to the phase of the second input clock signal RCK than the first input clock signal FCK. In an embodiment, the target phases (i.e., T2 to T7) lagging the phase of the first input clock signal FCK before reaching the phase of the intermediate clock signal MCK (i.e., T8) may be closer to the first input clock signal FCK than the second input clock signal SCK and the target phases (i.e., T9 to T14) leading the phases of the second input clock signal SCK before reaching the phase of the intermediate clock signal MCK (i.e., T8) may be closer to the second input clock signal SCK than the first input clock signal FCK. As such, in an embodiment, target phases between the first clock signal FCK and the intermediate clock signal MCK may be closer to the first input clock signal FCK than the target phases between the intermediate clock signal MCK and the second clock signal SCK. As such, in an embodiment, target phases between the second clock signal SCK and the intermediate clock signal MCK may be closer to the second input clock signal SCK than the target phases between the intermediate clock signal MCK and the first clock signal FCK. In an embodiment, the target phases between the intermediate clock signal MCK and the first clock signal FCK may be defined as close to the phase of the first input clock signal FCK. In an embodiment, the target phases between the intermediate clock signal MCK and the second clock signal SCK may be defined as close to the phase of the second input clock signal SCK.

Referring back to FIG. 1, when the mixed code signal R<0:2n−1> has one of the first to seventh logic values R1 to R7, the mixing circuit 120 may generate the output clock signal OCK by mixing the phases of the first input clock signal FCK and the intermediate clock signal MCK. When the mixed code signal R<0:2n−1> has one of the ninth to fifteenth logic values R9 to R15, the mixing circuit 120 may generate the output clock signal OCK by mixing the phases of the second input clock signal SCK and the intermediate clock signal MCK. When the mixed code signal R<0:2n−1> has the eighth logic value R8, the mixing circuit 120 may generate the output clock signal OCK by driving the intermediate clock signal MCK. In an embodiment, when the mixed code signal R<0:2n−1> has the eighth logic value R8, the mixing circuit 120 may be modified and changed to generate the output clock signal OCK by mixing the first and second input clock signals FCK and SCK at a one-to-one ratio.

The mixing circuit 120 may include a mixed code control circuit 121, a first driver circuit 122, a second driver circuit 123, and a third driver circuit 124. The mixed code control circuit 121 may receive a first mixed code signal R<0:n−1> and a second mixed code signal R<n:2n−1>, and generate an intermediate mixed code signal CR<0:n−1> based on the first mixed code signal R<0:n−1> and the second mixed code signal R<n:2n−1>. The mixed code control circuit 121 may change a logic value of the intermediate mixed code signal CR<0:n−1> according to logic values of the first and second mixed code signals R<0:n−1> and R<n:2n−1>. When the most significant bit of the first mixed code signal R<0:n−1>, that is, the $n^{th}$ bit R<n−1> of the mixed code signal is 0, the mixed code control circuit 121 may generate the intermediate mixed code signal CR<0:n−1> from the first mixed code signal R<0:n−1>. When the least significant bit of the second mixed code signal R<n:2n−1>, that is, the $n+1^{th}$ bit R<n> of the mixed code signal is 1, the mixed code control circuit 121 may generate the intermediate mixed code signal CR<0:n−1> from the second mixed code signal R<n:2n−1>. When the most significant bit of the first mixed code signal R<0:n−1> is 1 and the least significant bit of the second mixed code signal R<n:2n−1> is 0, the mixed code control circuit 121 may set bits of the intermediate mixed code signal CR<0:n−1> to 1 regardless of the logic values of the first and second mixed code signals R<0:n−1> and R<n:2n−1>. The mixed code control circuit 121 may generate a bar signal CRB<0:n−1> of the intermediate mixed code signal together with the intermediate mixed code signal CR<0:n−1>.

The first driver circuit 122 may receive the first input clock signal FCK and the first mixed code signal R<0:n−1>. The first driver circuit 122 may generate a first driving signal DRV1 by driving the first input clock signal FCK based on the first mixed code signal R<0:n−1>. The first driver circuit 122 may output the first driving signal DRV1 to a mixing node MN. Based on the first mixed code signal R<0:n−1>, the first driver circuit 122 may adjust the current driving ability for driving the first input clock signal FCK. The first driver circuit 122 may receive a bar signal RB<0:n−1> of the first mixed code signal together with the first mixed code signal R<0:n−1>. The first driver circuit 122 may include a plurality of pull-up drivers and a plurality of pull-down drivers, and the number of the plurality of pull-up drivers and the number of the plurality of pull-down drivers may be the same as the number of bits of the first mixed code signal R<0:n−1>, respectively. The plurality of pull-up drivers may include a plurality of P-channel MOS transistors, and the plurality of pull-down drivers may include a plurality of N-channel MOS transistors. The current driving ability of the plurality of pull-up drivers may be changed based on the first mixed code signal R<0:2n−1>, and the current driving ability of the plurality of pull-down drivers may be changed based on the bar signal RB<0:n−1> of the first mixed code signal.

The second driver circuit 123 may receive the second input clock signal SCK and the second mixed code signal R<n:2n−1>. The second driver circuit 123 generate a second driving signal DRV2 by driving the second input clock signal SCK based on the second mixed code signal R<n:2n−1>. The second driver circuit 123 may output the second driving signal DRV2 to the mixing node MN. Based on the second mixed code signal R<n:2n−1>, the second driver circuit 123 may adjust the current driving ability for driving the second input clock signal SCK. The second driver circuit 123 may receive the second mixed code signal R<n:2n−1> and a bar signal RB<n:2n−1> of the second mixed code signal. The second driver circuit 123 may include a plurality of pull-up drivers and a plurality of pull-down drivers, and the number of the plurality of pull-up drivers and the number of the plurality of pull-down drivers may be the same as the number of bits of the second mixed code signal R<n:2n−1>, respectively. The plurality of pull-up drivers may include a plurality of P-channel MOS transistors, and the plurality of pull-down drivers may include a plurality of N-channel MOS transistors. The current driving ability of the plurality of pull-up drivers may be changed based on the bar signal RB<n:2n−1> of the second mixed code signal, and the current driving ability of the plurality of pull-down drivers may be changed based on the second mixed code signal R<n:2n−1>.

The third driver circuit 124 may receive the intermediate clock signal MCK and the intermediate mixed code signal CR<0:n−1>. The third driver circuit 124 may generate a third driving signal DRV3 by driving the intermediate clock signal MCK based on the intermediate mixed code signal CR<0:n−1>. The third driver circuit 124 may output the third driving signal DRV3 to the mixing node MN. Based on the intermediate mixed code signal CR<0:n−1>, the third driver circuit 124 may adjust the current driving ability for driving the intermediate clock signal MCK. The third driver circuit 124 may receive a bar signal CRB<0:n−1> of the intermediate mixed code signal together with the intermediate mixed code signal CR<0:n−1>. The third driver circuit 124 may include a plurality of pull-up drivers and a plurality of pull-down drivers, and the number of the plurality of pull-up drivers and the number of the plurality of pull-down drivers may be the same as the number of bits of the intermediate mixed code signal CR<0:n−1>, respectively. The plurality of pull-up drivers may include a plurality of P-channel MOS transistors, and the plurality of pull-down drivers may include a plurality of N-channel MOS transistors. The current driving ability of the plurality of pull-up drivers may be changed based on the bar signal CRB<0:n−1> of the intermediate mixed code signal, and the current driving ability of the plurality of pull-down drivers may be changed based on the intermediate mixed code signal CR<0:n−1>.

The first driving signal DRV1 generated from the first driver circuit 122, the second driving signal DRV2 generated from the second driver circuit 123, and the third driving signal DRV3 generated from the third driver circuit 124 may be mixed at the mixing node MN. The output clock signal OCK may be generated from the mixing node MN. The mixing circuit 120 may further include an output circuit 125. The output circuit 125 may generate the output clock signal OCK by driving a signal of the mixing node MN. The first to third driver circuits 122 to 124 may be inverting drivers, and the output circuit 125 may include an odd number of inverters. In an embodiment, when the first to third driver circuits 122 to 124 are non-inverting drivers, the output circuit 125 may include an even number of inverters.

The phase mixer circuit 100 may further include a first delay circuit 131 and a second delay circuit 132. The first delay circuit 131 may receive the first input clock signal FCK, and provide the first driver 122 with a delayed first input clock signal obtained by delaying the first input clock signal FCK. The second delay circuit 132 may receive the second input clock signal SCK, and provide the second driver 123 with a delayed second input clock signal obtained by delaying the second input clock signal SCK. The delay times of the first and second delay circuits 131 and 132 may be substantially equal to the times required for the intermediate clock generation circuit 110 to generate the intermediate clock signal MCK from the first and second input clock signals FCK and SCK, respectively.

Figure 3:
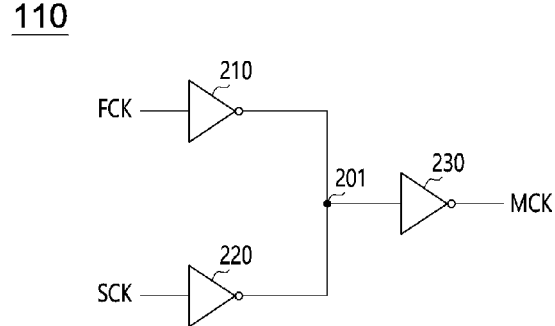
FIG. 3 is a diagram illustrating a configuration of an embodiment of an intermediate clock generation circuit illustrated in FIG. 1.

FIG. 3 is a diagram illustrating the configuration of the intermediate clock generation circuit 110 illustrated in FIG. 1. Referring to FIG. 3, the intermediate clock generation circuit 110 may include a first inverter 210, a second inverter 220, and a third inverter 230. The first inverter 210 may receive the first input clock signal FCK and invert the first input clock signal FCK. The first inverter 210 may output an inverted first input clock signal to a node 201. The second inverter 220 may receive the second input clock signal SCK and invert the second input clock signal SCK. The second inverter 220 may output an inverted second input clock signal to the node 201. The third inverter 230 may receive a signal of the node 201, invert the signal of the node 201, and output the intermediate clock signal MCK. The current driving ability of the first inverter 210 may be substantially the same as the current driving ability of the second inverter 220. The current driving ability of the third inverter 230 may be the same as or different from the current driving abilities of the first and second inverters 210 and 220.

Figure 4:
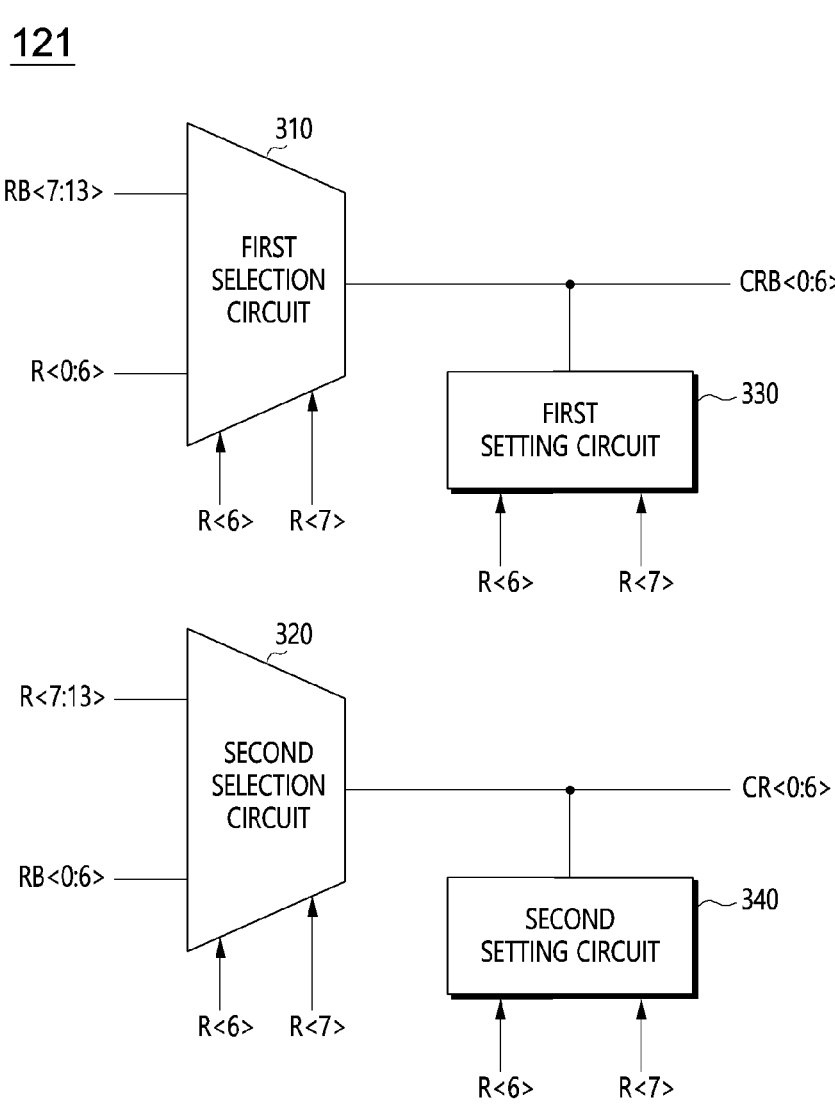
FIG. 4 is a diagram illustrating a configuration of an embodiment of a mixed code control circuit illustrated in FIG. 1.

FIG. 4 is a diagram illustrating the configuration of the mixed code control circuit 121 illustrated in FIG. 1. Referring to FIG. 4, the mixed code control circuit 121 may include a first selection circuit 310, a second selection circuit 320, a first setting circuit 330, and a second setting circuit 340. For clarity of explanation, it is assumed that n is 7 and the mixed code signal R<0:2n−1> may include 14 bits. The first selection circuit 310 may receive the first mixed code signal R<0:6> and the second mixed code signal R<7:13>, and generate the bar signal CRB<0:6> of the intermediate mixed code signal. The first selection circuit 310 may output one of the first mixed code signal R<0:6> and the bar signal RB<7:13> of the second mixed code signal as the bar signal CR<0:6> of the intermediate mixed code signal based on the logic levels of the most significant bit R<6> of the first mixed code signal and the least significant bit R<7> of the second mixed code signal. When the most significant bit R<6> of the first mixed code signal is 0, the first selection circuit 310 may output the first mixed code signal R<0:6> as the bar signal CRB<0:6> of the intermediate mixed code signal. The first selection circuit 310 may output the first to seventh bits R<0:6> of the mixed code signal as the first to seventh bits CRB<0:6> of the bar signal of the intermediate mixed code signal. When the least significant bit R<7> of the second mixed code signal is 1, the first selection circuit 310 may output the bar signal RB<7:13> of the second mixed code signal as the bar signal CRB<0:6> of the intermediate mixed code signal. The first selection circuit 310 may output the eighth to fourteenth bits RB<7:13> of the bar signal of the mixed code signal as the first to seventh bits CRB<0:6> of the bar signal of the intermediate mixed code signal.

The second selection circuit 320 may receive the first mixed code signal R<0:6> and the second mixed code signal R<7:13>, and generate the intermediate mixed code signal CR<0:6>. The second selection circuit 320 may output one of the bar signal RB<0:6> of the first mixed code signal and the second mixed code signal R<7:13> as the intermediate mixed code signal CR<0:6> based on the logic levels of the most significant bit R<6> of the first mixed code signal and the least significant bit R<7> of the second mixed code signal. When the most significant bit R<6> of the first mixed code signal is 0, the second selection circuit 320 may output the bar signal RB<0:6> of the first mixed code signal as the intermediate mixed code signal CR<0:6>. The second selection circuit 320 may output the first to seventh bits RB<0:6> of the bar signal of the mixed code signal as the first to seventh bits CR<0:6> of the intermediate mixed code signal. When the least significant bit R<7> of the second mixed code signal is 1, the second selection circuit 320 may output the second mixed code signal R<7:13> as the intermediate mixed code signal CR<0:6>. The second selection circuit 320 may output the eighth to fourteenth bits R<7:13> of the mixed code signal as the first to seventh bits R<0:6> of the intermediate mixed code signal.

The first setting circuit 330 may set the logic levels of the bar signal CRB<0:6> of the intermediate mixed code signal based on the first mixed code signal R<0:6> and the second mixed code signal R<7:13>. The first setting circuit 330 may receive the most significant bit R<6> of the first mixed code signal and the least significant bit R<7> of the second mixed code signal. When the most significant bit R<6> of the first mixed code signal is 1 and the least significant bit R<7> of the second mixed code signal is 0, the first setting circuit 330 may set the bits of the bar signal CRB<0:6> of the intermediate mixed code signal to 0. When the most significant bit R<6> of the first mixed code signal is 0 or the least significant bit R<7> of the second mixed code signal is 1, the first setting circuit 330 might not change the logic levels of the bits of the bar signal CRB<0:6> of the intermediate mixed code signal.

The second setting circuit 340 may set the logic levels of the intermediate mixed code signal CR<0:6> based on the first mixed code signal R<0:6> and the second mixed code signal R<7:13>. The second setting circuit 340 may receive the most significant bit R<6> of the first mixed code signal and the least significant bit R<7> of the second mixed code signal. When the most significant bit R<6> of the first mixed code signal is 1 and the least significant bit R<7> of the second mixed code signal is 0, the second setting circuit 340 may set the bits of the intermediate mixed code signal CR<0:6> to 1. When the most significant bit R<6> of the first mixed code signal is 0 or the least significant bit R<7> of the second mixed code signal is 1, the second setting circuit 340 might not change the logic levels of the bits of the intermediate mixed code signal CR<0:6>.

FIG. 5 is a diagram illustrating the configurations of the first setting circuit 330 and the second setting circuit 340 illustrated in FIG. 4. Referring to FIG. 5, the first setting circuit 330 may include a first transistor 411, a second transistor 412, a third transistor 413, a fourth transistor 414, a fifth transistor 415, and a sixth transistor 416. The first transistor 411, the second transistor 412, and the fifth transistor 415 may be P-channel MOS transistors, and the third transistor 413, the fourth transistor 414, and the sixth transistor 416 may be N-channel MOS transistors. A gate of the first transistor 411 may receive the most significant bit RB<6> of the bar signal of the first mixed code signal, and a source of the first transistor 411 may be connected to a terminal to which a first power supply voltage VH is supplied. The first power supply voltage VH may have a sufficiently high voltage level to be determined as a high logic level. A gate of the second transistor 412 may receive the least significant bit R<7> of the second mixed code signal, and a source of the second transistor 412 may be connected to a drain of the first transistor 411. A gate of the third transistor 413 may receive the most significant bit R<6> of the first mixed code signal, and a source of the third transistor 413 may be connected to a terminal to which a second power supply voltage VL is supplied. The second power supply voltage VL may have a lower voltage level than the first power supply voltage VH, and may have a sufficiently low voltage level to be determined as a low logic level. A gate of the fourth transistor 414 may receive the least significant bit RB<7> of the bar signal of the second mixed code signal, and a source of the fourth transistor 414 may be connected to a drain of the third transistor 413. A gate of the fifth transistor 415 may receive the first power supply voltage VH, and a source of the fifth transistor 415 may be connected to a drain of the second transistor 412. A gate of the sixth transistor 416 may receive the first power supply voltage VH, a drain of the sixth transistor 416 may be connected to a drain of the fifth transistor 415, and a source of the sixth transistor 416 may be connected to a drain of the fourth transistor 414. The drains of the fifth and sixth transistors 415 and 416 may be connected to the bar signal CRB<0:6> of the intermediate mixed code signal. When the most significant bit R<6> of the first mixed code signal is 1, the most significant bit RB<6> of the bar signal of the first mixed code signal is 0, the least significant bit R<7> of the second mixed code signal is 0, and the least significant bit RB<7> of the bar signal of the second mixed code signal is 1, the first to fourth transistors 411 to 414 may all be turned on, and the sixth transistor 416 may drive the bar signal CRB<0:6> of the intermediate mixed code signal with the second power supply voltage VL to set the bar signal CRB<0:6> of the intermediate mixed code signal to 0.

The second setting circuit 340 may include a first transistor 421, a second transistor 422, a third transistor 423, a fourth transistor 424, a fifth transistor 425, and a sixth transistor 426. The first transistor 421, the second transistor 422, and the fifth transistor 425 may be P-channel MOS transistors, and the third transistor 423, the fourth transistor 424, and the sixth transistor 426 may be an N-channel MOS transistors. A gate of the first transistor 421 may receive the most significant bit RB<6> of the bar signal of the first mixed code signal, and a source of the first transistor 421 may be connected to a terminal to which the first power supply voltage VH is supplied. A gate of the second transistor 422 may receive the least significant bit R<7> of the second mixed code signal, and a source of the second transistor 422 may be connected to a drain of the first transistor 421. A gate of the third transistor 423 may receive the most significant bit R<6> of the first mixed code signal, and a source of the third transistor 423 may be connected to a terminal to which the second power supply voltage VL is supplied. A gate of the fourth transistor 424 may receive the least significant bit RB<7> of the bar signal of the second mixed code signal, and a source of the fourth transistor 424 may be connected to a drain of the third transistor 423. A gate of the fifth transistor 425 may receive the second power supply voltage VL, and a source of the fifth transistor 425 may be connected to a drain of the second transistor 422. A gate of the sixth transistor 426 may receive the second power supply voltage VL, a drain of the sixth transistor 426 may be connected to a drain of the fifth transistor 425, and a source of the sixth transistor 426 may be connected to a drain of the fourth transistor 424. The drains of the fifth and sixth transistors 425 and 426 may be connected to the intermediate mixed code signal. When the most significant bit R<6> of the first mixed code signal is 1, the least significant bit RB<7> of the bar signal of the second mixed code signal is 1, the least significant bit R<7> of the second mixed code signal is 0, and the most significant bit RB<6> of the bar signal of the first mixed code signal is 0, the first to fourth transistors 421 to 424 may all be turned on, and the fifth transistor 425 may drive the intermediate mixed code signal CR<0:6> with the first power supply voltage VH to set the intermediate mixed code signal CR<0:6> to 1.

FIG. 6 is a flowchart showing a phase mixing method of the phase mixer circuit 100 in accordance with an embodiment. With reference to FIGS. 1 to 6, the operation of the phase mixer circuit 100 in accordance with an embodiment is described as follows. In 510, the phase mixer circuit 100 may receive the first input clock signal FCK and the second input clock signal SCK. The phase mixer circuit 100 may receive the mixed code signal R<0:2n−1> and perform a phase mixing operation of the first and second input clock signals FCK and SCK based on the mixed code signal R<0:2n−1>. In 520, the phase mixer circuit 100 may generate the intermediate clock signal MCK having an intermediate phase between the phases of the first and second input clock signals FCK and SCK. By mixing the phases of the first and second input clock signals FCK and SCK at a one-to-one ratio, the intermediate clock generation circuit 110 may generate the intermediate clock signal MCK having an intermediate phase between the phases of the first and second input clock signals FCK and SCK. In 530, the phase mixer circuit 110 may determine the logic value of the mixed code signal R<0:2n−1>. Based on the logic level of the most significant bit R<n−1> of the first mixed code signal and the logic level of the least significant bit R<n> of the second mixed code signal, the mixed code control circuit 121 may determine the logic value of the mixed code signal R<0:2n−1>.

For clarity of explanation, it is assumed that n is 7 and the mixed code signal R<0:2n−1> may include 14 bits. When the logic value of the mixed code signal R<0:2n−1> is one of the first to seventh values R1 to R7, the phase mixer circuit 110 may generate the output clock signal OCK by mixing the phases of the first input clock signal FCK and the intermediate clock signal MCK in 540. The mixed code control circuit 121 may determine the logic value of the mixed code signal R<0:2n−1> and generate the intermediate mixed code signal CR<0:n−1>. When the logic value of the mixed code signal R<0:2n−1> is one of the first to seventh values R1 to R7, the most significant bit R<n−1> of the first mixed code signal may be 0. When the most significant bit R<n−1> of the first mixed code signal is 0, the mixed code control circuit 121 may output the first mixed code signal R<0:n−1> as the bar signal CRB<0:n−1> of the intermediate code signal and output the bar signal RB<0:n−1> of the first mixed code signal as the intermediate code signal CR<0:n−1>. The first driver circuit 122 may generate the first driving signal DRV1 by driving the first input clock signal FCK based on the first mixed code signal R<0:n−1> and the bar signal RB<0:n−1> of the first mixed code signal, and the third driver circuit 124 may generate the third driving signal DRV3 by driving the intermediate clock signal MCK based on the bar signal CRB<0:n−1> of the intermediate mixed code signal and the intermediate mixed code signal CR<0:n−1>. Because the bits of the second mixed code signal R<n:2n−1> are all 0, the second driver circuit 123 may be deactivated. The phases of the first driving signal DRV1 and the third driving signal DRV3 may be mixed at the mixing node MN, and the output circuit 125 may generate the output clock signal OCK by driving the signal of the mixing node MN.

When the logic value of the mixed code signal R<0:2n−1> is the eighth value R8, the phase mixer circuit 100 may generate the output clock signal OCK by driving the intermediate clock signal MCK in 550. The mixed code control circuit 121 may determine the logic value of the mixed code signal R<0:2n−1> and generate the intermediate mixed code signal CR<0:n−1>. When the logic value of the mixed code signal R<0:2n−1> is the eighth value R8, the most significant bit R<n−1> of the first mixed code signal may be 1 and the least significant bit R<n> of the second mixed code signal may be 0. The mixed code control circuit 121 may set the bits of the intermediate mixed code signal CR<0:n−1> to 1 regardless of the first and second mixed code signals R<0:n−1> and R<n:2n−1>, and set the bits of the bar signal CRB<0:n−1> of the intermediate mixed code to 0. The third driver circuit 124 may generate the third driving signal DRV3 by driving the intermediate clock signal MCK based on the bar signal CRB<0:n−1> of the intermediate mixed code signal and the intermediate mixed code signal CR<0:n−1>. Because the bits of the first mixed code signal R<0:n−1> are all 1 and the bits of the second mixed code signal R<n:2n−1> are all 0, the first and second driver circuits 122 and 123 may be deactivated. Only the third driving signal DRV3 may be output to the mixing node MN, and the output circuit 125 may generate the output clock signal OCK by driving the signal of the mixing node MN.

When the logic value of the mixed code signal R<0:2n−1> is one of the ninth to fifteenth values R9 to R15, the phase mixer circuit 100 may generate the output clock signal OCK by mixing the phases of the second input clock signal SCK and the intermediate clock signal MCK in 560. The mixed code control circuit 121 may determine the logic value of the mixed code signal R<0:2n−1> and generate the intermediate mixed code signal CR<0:n−1>. When the logic value of the mixed code signal R<0:2n−1> is one of the ninth to fifteenth values R9 to R15, the least significant bit R<n> of the second mixed code signal may be 1. The mixed code control circuit 121 may output the second mixed code signal R<n: 2n−1> as the intermediate code signal CR<0:n−1>, and output the bar signal RB<n:2n−1> of the second mixed code signal as the bar signal CRB<0:n−1> of the intermediate code signal. The second driver circuit 123 may generate the second driving signal DRV2 by driving the second input clock signal SCK based on the second mixed code signal R<n:2n−1> and the bar signal RB<n:2n−1> of the second mixed code signal, and the third driver circuit 124 may generate the third driving signal DRV3 by driving the intermediate clock signal MCK based on the bar signal CRB<0:n−1> of the intermediate mixed code signal and the intermediate mixed code signal CR<0:n−1>. Because the bits of the first mixed code signal R<0:n−1> are all 1, the first driver circuit 122 may be deactivated. The phases of the second driving signal DRV2 and the third driving signal DRV3 may be mixed at the mixing node MN, and the output circuit 125 may generate the output clock signal OCK by driving the signal of the mixing node MN.

Figure 7A:
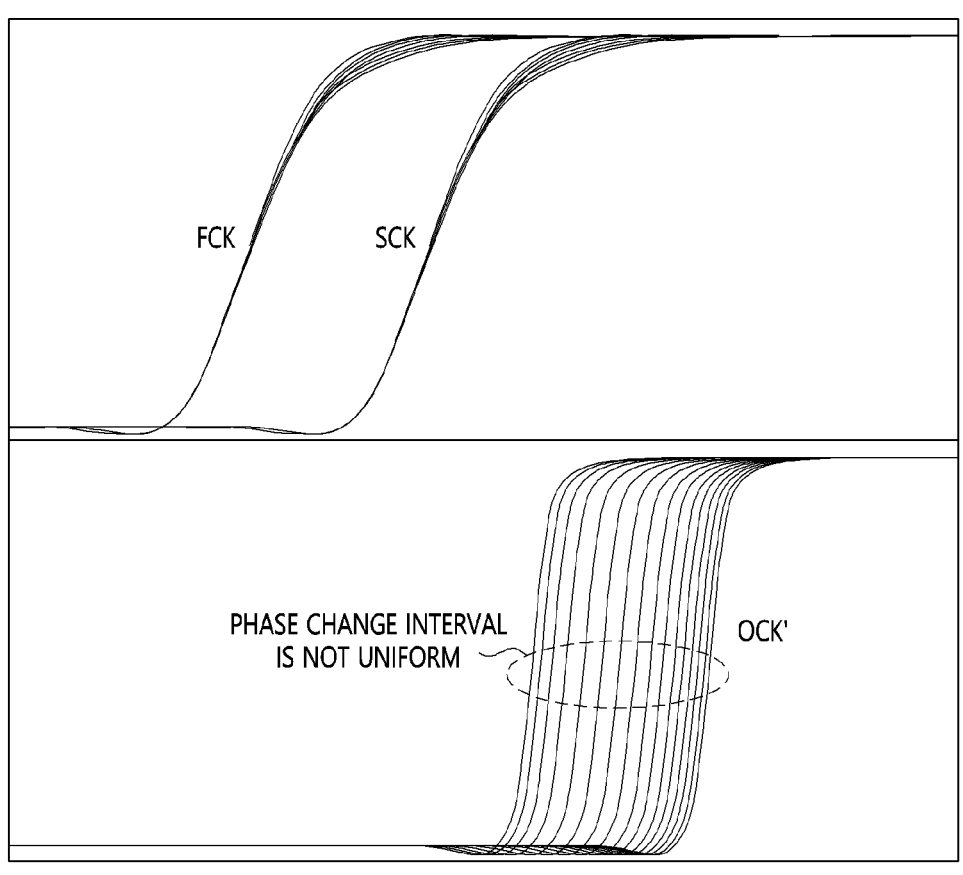
FIG. 7A is a waveform diagram illustrating an operation of a general phase mixer circuit and FIG. 7B is a waveform diagram illustrating an operation of the phase mixer circuit in accordance with an embodiment.
Figure 7B:
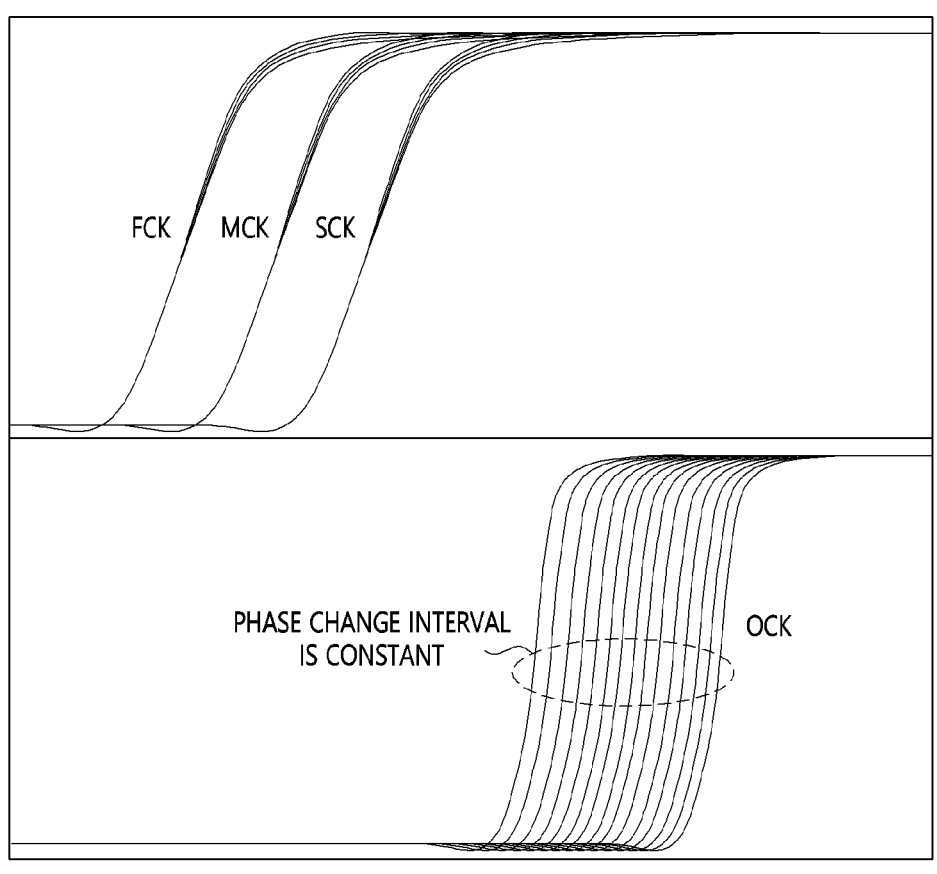

FIG. 7A is a waveform diagram illustrating the operation of a comparative example of a phase mixer circuit, and FIG. 7B is a waveform diagram illustrating the operation of the phase mixer circuit 100 in accordance with an embodiment. Referring to FIG. 7A, the phase mixer circuit of the comparative example may generate an output clock signal OCK' by mixing the phases of the first input clock signal FCK and the second input clock signal SCK. The closer to the phases of the first and second input clock signals FCK and SCK, the smaller the phase change interval of the output clock signal OCK', and the farther away from the phases of the first and second input clock signals FCK and SCK, the greater the phase change interval of the output clock signal OCK'. As the logic value of the mixed code signal R<0:2n−1> increases, the phase change interval of the output clock signal OCK' may be gradually widened, and after the intermediate phase of the first and second input clock signals FCK and SCK, the phase change interval of the output clock signal OCK' may be gradually narrowed. When the phase change interval of the output clock signal OCK' is not uniform according to the logic value of the mixed code signal R<0:2n−1>, the precision of the output clock signal OCK' may be reduced, and the operation reliability of a semiconductor apparatus including the phase mixer circuit may be reduced.

Referring to FIG. 7B, the phase mixer circuit 100 in accordance with an embodiment may generate the intermediate clock signal MCK from the first and second input clock signals FCK and SCK. When a target phase is closer to the phase of the first input clock signal FCK, the phase mixer circuit 100 may generate the output clock signal OCK by mixing the phases of the first input clock signal FCK and the intermediate clock signal MCK, and when the target phase is close to the phase of the second input clock signal SCK, the phase mixer circuit 100 may generate the output clock signal OCK by mixing the phases of the second input clock signal SCK and the intermediate clock signal MCK. In an embodiment, the phase mixer circuit 100 may allow the phase change interval of the output clock signal OCK to be constant according to changes in the logic value of the mixed code signal R<0:2n−1>, and improve the linearity of the phase of the output clock signal OCK. Accordingly, in an embodiment, the quality of the output clock signal OCK may be improved and the operating performance of a semiconductor apparatus including the phase mixer circuit 100 may be improved.

Figure 8:
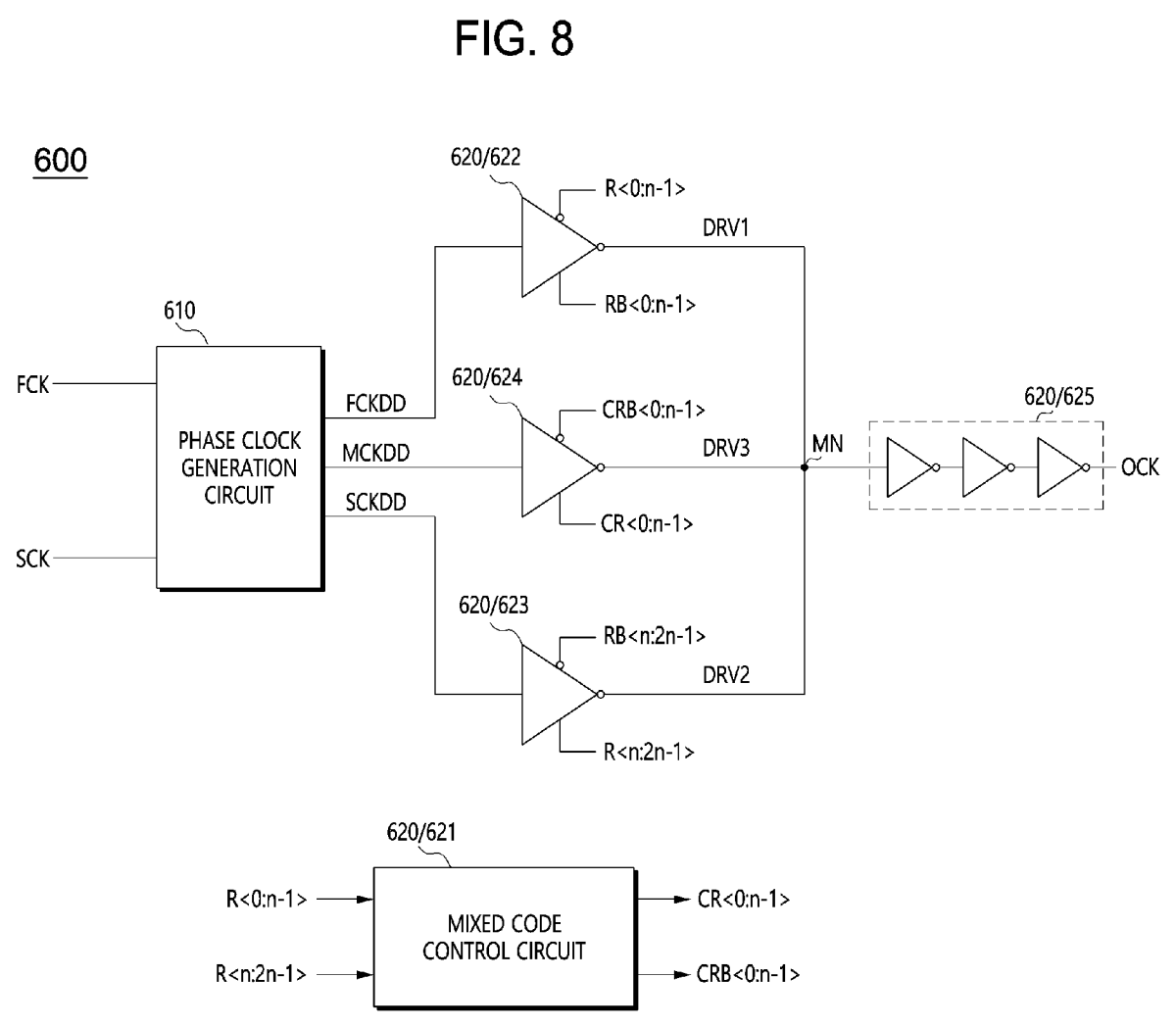

FIG. 8 is a diagram illustrating the configuration of a phase mixer circuit 600 in accordance with an embodiment. Referring to FIG. 8, the phase mixer circuit 600 may receive the first input clock signal FCK and the second input clock signal SCK and generate the output clock signal OCK. The phase mixer circuit 600 may include a phase clock generation circuit 610 and a mixing circuit 620. The phase mixer circuit 600 may be substantially the same as the phase mixer circuit 100 except that the intermediate clock generation circuit 110, the first delay circuit 131, and the second delay circuit 132 illustrated in FIG. 1 are replaced with the phase clock generation circuit 610. Redundant descriptions of the same components are omitted. The mixing circuit 620 may include a first driver circuit 622, a second driver circuit 623, a third driver circuit 624, a mixed code control circuit 621, and an output circuit 625. The phase clock generation circuit 610 may receive the first input clock signal FCK and the second input clock signal SCK and generate a first phase clock signal FCKDD, a second phase clock signal SCKDD, and a third phase clock signal MCKDD. The first phase clock signal FCKDD may have a phase corresponding to the first input clock signal FCK. The second phase clock signal SCKDD may have a phase corresponding to the second input clock signal SCK. The third phase clock signal MCKDD may have an intermediate phase between the phases of the first and second phase clock signals FCKDD and SCKDD.

The phase clock generation circuit 610 may generate the first and second phase clock signals FCKDD and SCKDD, respectively, by delaying the first and second input clock signals FCK and SCK by substantially the same time. The phase clock generation circuit 610 may generate the first phase clock signal FCKDD by delaying the first input clock signal FCK. The phase clock generation circuit 610 may generate a first delayed clock signal by delaying the first input clock signal FCK by a first time, and generate the first phase clock signal FCKDD by delaying the first delayed clock signal by a second time. The first time may be substantially the same as or different from the second time. The phase clock generation circuit 610 may generate the second phase clock signal SCKDD by delaying the second input clock signal SCK. The phase clock generation circuit 610 may generate a second delayed clock signal by delaying the second input clock signal SCK by the first time, and generate the second phase clock signal SCKDD by delaying the second delayed clock signal by the second time. The phase clock generation circuit 610 may generate the third phase clock signal MCKDD by mixing the phases of the first and second delayed clock signals at, for example, a one-to-one ratio. The time required for the phase clock generation circuit 610 to generate the third phase clock signal MCKDD by mixing the first and second delayed clock signals may be substantially the same as the second time. In an embodiment, the phase clock generation circuit 610 may generate the first to third phase clock signals FCKDD, SCKDD, and MCKDD delayed by a certain time from the first and second input clock signals FCK and SCK, thereby further improving the quality of the output clock signal OCK output by the mixing circuit 620. The mixing circuit 620 may be modified to receive the first phase clock signal FCKDD, the second phase clock signal SCKDD, and the third phase clock signal MCKDD instead of the first input clock signal FCK, the second input clock signal SCK, and the intermediate clock signal MCK in FIG. 1. The mixing circuit 620 may have substantially the same structure as the mixing circuit 120 and perform the same operation, except that the mixing circuit 620 generates the output clock signal OCK by mixing the phases of the first to third phase clock signals FCKDD, SCKDD, and RCKDD based on the mixed code signal R<0:2n−1>.

Figure 9:
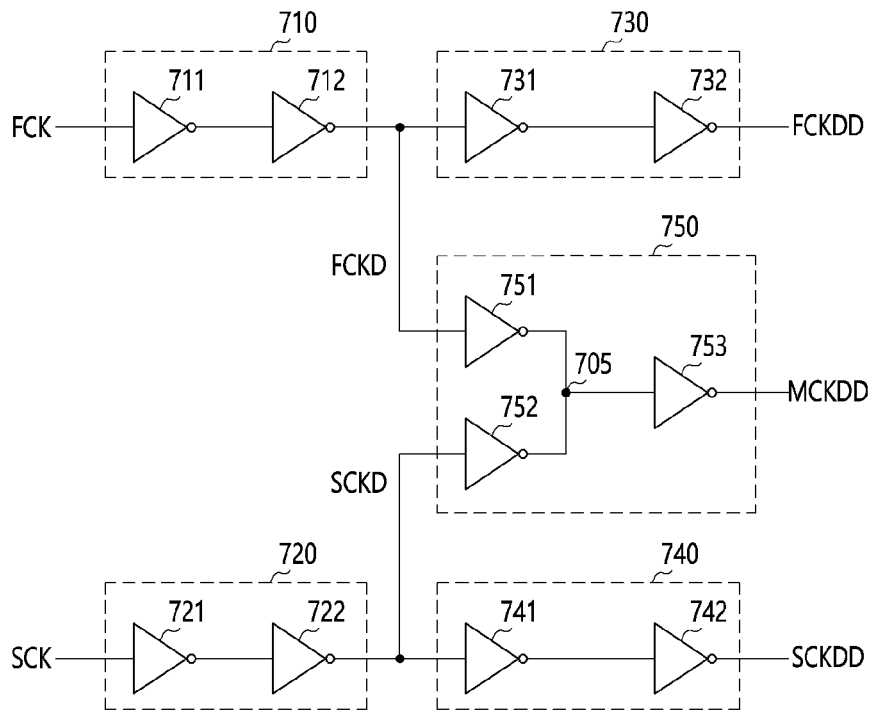
FIG. 9 is a diagram illustrating a configuration of an embodiment of a phase clock generation circuit illustrated in FIG. 8.

FIG. 9 is a diagram illustrating the configuration of the phase clock generation circuit 610 illustrated in FIG. 8. Referring to FIG. 9, the phase clock generation circuit 610 may include a first delay circuit 710, a second delay circuit 720, a third delay circuit 730, a fourth delay circuit 740, and an intermediate clock generation circuit 750. The first delay circuit 710 may receive the first input clock signal FCK, and generate the first delayed clock signal FCKD by delaying the first input clock signal FCK. The first delay circuit 710 may generate the first delayed clock signal FCKD by delaying the first input clock signal FCK by the first time. The second delay circuit 720 may receive the second input clock signal SCK, and generate the second delayed clock signal SCKD by delaying the second input clock signal SCK. The second delay circuit 720 may generate the second delayed clock signal SCKD by delaying the second input clock signal SCK by the first time. The third delay circuit 730 may receive the first delayed clock signal FCKD, and generate the first phase clock signal FCKDD by delaying the first delayed clock signal FCKD. The third delay circuit 730 may generate the first phase clock signal FCKDD by delaying the first delayed clock signal FCKD by the second time. The fourth delay circuit 740 may receive the second delayed clock signal SCKD, and generate the second phase clock signal SCKDD by delaying the second delayed clock signal SCKD. The fourth delay circuit 740 may generate the second phase clock signal SCKDD by delaying the second delayed clock signal SCKD by the second time. The intermediate clock generation circuit 750 may receive the first and second delayed clock signals FCKD and SCKD, and generate the third phase clock signal MCKDD by mixing the phases of the first and second delayed clock signals FCKD and SCKD at, for example, a one-to-one ratio.

The first delay circuit 710 may include a first inverter 711 and a second inverter 712. The first inverter 711 may receive the first input clock signal FCK and invert the first input clock signal FCK. The second inverter 712 may receive an output signal of the first inverter 711, and output the first delayed clock signal FCKD by inverting the output signal of the first inverter 711. The second delay circuit 720 may include a third inverter 721 and a fourth inverter 722. The third inverter 721 may receive the second input clock signal SCK and invert the second input clock signal SCK. The fourth inverter 722 may receive an output signal of the third inverter 721, and output the second delayed clock signal SCKD by inverting the output signal of the third inverter 721. The third delay circuit 730 may include a fifth inverter 731 and a sixth inverter 732. The fifth inverter 731 may receive the first delayed clock signal FCKD and invert the first delayed clock signal FCKD. The sixth inverter 732 may receive an output signal of the fifth inverter 731, and output the first phase clock signal FCKDD by inverting the output signal of the fifth inverter 731. The fourth delay circuit 740 may include a seventh inverter 741 and an eighth inverter 742. The seventh inverter 741 may receive the second delayed clock signal SCKD and invert the second delayed clock signal SCKD. The eighth inverter 742 may receive an output signal of the seventh inverter 741, and output the second phase clock signal SCKDD by inverting the output signal of the seventh inverter 741. The intermediate clock generation circuit 750 may include a ninth inverter 751, a tenth inverter 752, and an eleventh inverter 753. The ninth inverter 751 may receive the first delayed clock signal FCKD and invert the first delayed clock signal FCKD. The ninth inverter 751 may output an inverted first delayed clock signal to a node 705. The tenth inverter 752 may receive the second delayed clock signal SCKD and invert the second delayed clock signal SCKD. The tenth inverter 752 may output an inverted second delayed clock signal to the node 705. The eleventh inverter 753 may receive a signal of the node 705, and output the third phase clock signal MCKDD by inverting the signal of the node 705. The current driving abilities of the first to fourth inverters 711, 712, 721, and 722 may be substantially the same. The current driving abilities of the fifth to eleventh inverters 731, 732, 741, 742, 751, 752, and 753 may be substantially the same.

Figure 10:
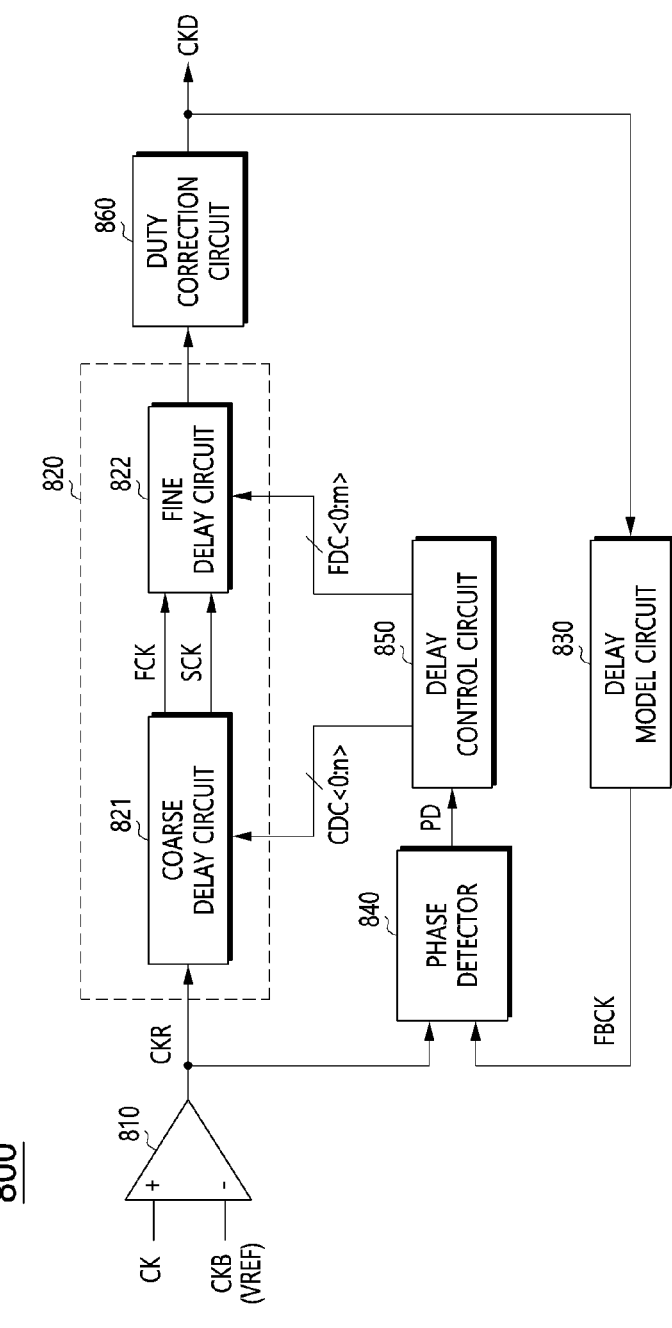
FIG. 10 is a diagram illustrating a configuration of a clock generation circuit in accordance with an embodiment.

FIG. 10 is a diagram illustrating the configuration of a clock generation circuit 800 in accordance with an embodiment. Referring to FIG. 10, the clock generation circuit 800 may receive a clock signal CK and generate a delay-locked clock signal CKD. The clock generation circuit 800 may be a delay-locked loop circuit that generates the delay-locked clock signal CKD by performing a delay locking operation on the clock signal CK. The clock generation circuit 800 may include a clock buffer 810, a delay circuit 820, a delay model circuit 830, a phase detector 840, and a delay control circuit 850. The clock buffer 810 may receive the clock signal CK and generate a reference clock signal CKR by buffering the clock signal CK. The clock signal CK may be provided as a differential signal together with a clock bar signal CKB, or may be provided as a single-ended signal. When the clock signal CK is provided as a differential signal, the clock buffer 810 may generate the reference clock signal CKR by differentially amplifying the clock signal CK and the clock bar signal CKB. When the clock signal CK is provided as a single-ended signal, the clock buffer 810 may generate the reference clock signal CKR by differentially amplifying the clock signal CK and a reference voltage VREF. The reference voltage VREF may have an intermediate voltage level in a voltage range in which the clock signal CK swings.

The delay circuit 820 may receive the reference clock signal CKR, and generate the delay-locked clock signal CKD by delaying the reference clock signal CKR. The delay circuit 820 may receive a delay control signal and variably delay the reference clock signal CKR. The delay control signal may be a digital signal, and the delay circuit 820 may be a digitally controlled delay circuit. The delay circuit 820 may include a coarse delay circuit 821 and a fine delay circuit 822, and the delay control signal may include a coarse control signal CDC<0:n> and a fine control signal FDC<0:m>. Here, n and m may each be any integer of 2 or more. The course delay circuit 821 may receive the reference clock signal CKR and the course control signal CDC<0:n>, and variably delay the reference clock signal CKR based on the course control signal CDC<0:n>. As a logic value of the coarse control signal CDC<0:n> increases or decreases, the coarse delay circuit 821 may gradually delay the reference clock signal CKR by unit time. The coarse delay circuit 821 may generate a first delayed clock signal FCK and a second delayed clock signal SCK by delaying the reference clock signal CKR. The first delayed clock signal FCK may have a phase that leads the second delayed clock signal SCK by the unit time. The fine delay circuit 822 may receive the first delayed clock signal FCK, the second delayed clock signal SCK, and the fine control signal FDC<0:m>, and output the delay-locked clock signal CKD. The fine delay circuit 822 may generate the delay-locked clock signal CKD by mixing the phases of the first and second delayed clock signals FCK and SCK based on the fine control signal FDC<0:m>. The fine delay circuit 822 may include a phase mixer that mixes the phases of the first and second delayed clock signals FCK and SCK. At least one of the phase mixer circuit 100 illustrated in FIG. 1 and the phase mixer circuit 600 illustrated in FIG. 8 may be applied as the fine delay circuit 822.

The delay model circuit 830 may receive the delay-locked clock signal CKD, and generate a feedback clock signal FBCK by delaying the delay-locked clock signal CKD by a modeled delay time. The phase detector 840 may receive the reference clock signal CKR and the feedback clock signal FBCK. The phase detector 840 may generate a phase detection signal PD by comparing phases of the reference clock signal CKR and the feedback clock signal FBCK. The delay control circuit 850 may receive the phase detection signal PD and generate the course control signal CDC<0:n> and the fine control signal FDC<0:m>. The delay control circuit 850 may increase or decrease logic values of the course control signal CDC<0:n> and the fine control signal FDC<0:m> according to a logic level of the phase detection signal PD. The delay fixing operation performed by the clock generation circuit 800 may include a coarse delay operation and a fine delay operation. The clock generation circuit 800 may preferentially perform the coarse delay operation and perform the fine delay operation after the coarse delay operation is completed. During the course delay operation, the delay control circuit 850 may change the logic value of the course control signal CDC<0:n> based on the phase detection signal PD. When the reference clock signal CKR and the feedback clock signal FBCK are in-phase, the delay control circuit 850 may generate a locking signal and complete the course delay operation. When the coarse delay operation is completed, the fine delay operation may be performed. During the fine delay operation, the delay control circuit 850 may change the logic value of the fine control signal FDC<0:m> based on the phase detection signal PD. The clock generation circuit 800 may further include a duty correction circuit 860. The duty correction circuit 860 may receive an output signal of the delay circuit 820, and generate the delay-locked clock signal CKD by correcting the duty cycle of the output signal of the delay circuit 820.

Figure 11:
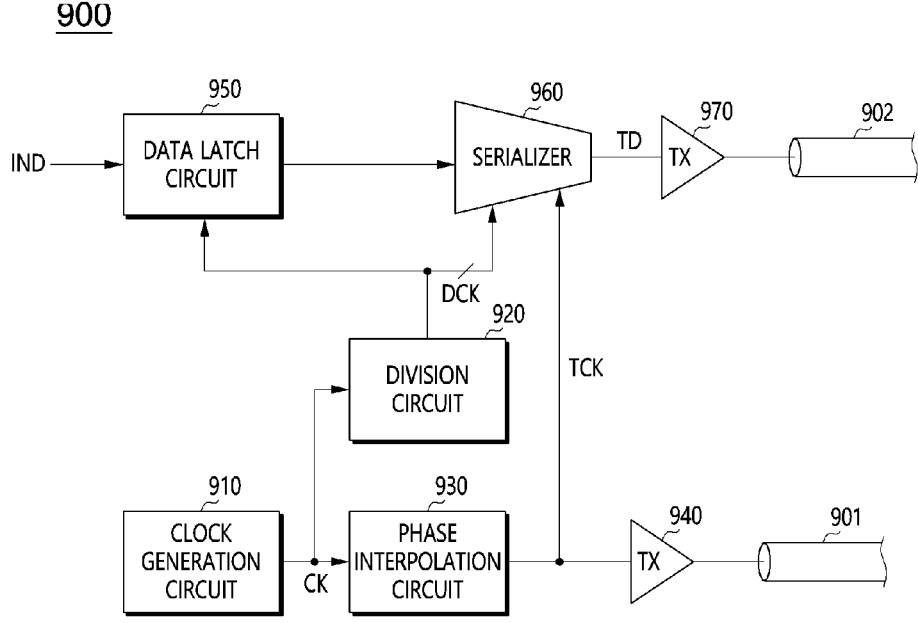
FIG. 11 is a diagram illustrating a configuration of a semiconductor apparatus in accordance with an embodiment.

FIG. 11 is a diagram illustrating the configuration of a semiconductor apparatus 900 in accordance with an embodiment disclosure. Referring to FIG. 11, the semiconductor apparatus 900 may transmit a transmission data signal TD by synchronizing an internal data signal IND with a clock signal CK. The semiconductor apparatus 900 may include a clock generation circuit 910, a division circuit 920, a phase interpolation circuit 930, a clock transmitter 940 (TX), a data latch circuit 950, a serializer 960, and a data transmitter 970 (TX). The clock generation circuit 910 may generate the clock signal CK. The clock generation circuit 910 may include an oscillator, a phase-locked loop circuit, or the like to generate the clock signal CK that toggles at a constant cycle. The clock generation circuit 910 may additionally include a delay-locked loop circuit in order to adjust a phase of the clock signal CK. The division circuit 920 may receive the clock signal CK, and generate a plurality of divided clock signals DCK by dividing a frequency of the clock signal CK. The plurality of divided clock signals DCK may sequentially have a constant phase difference. The phase interpolation circuit 930 may receive the clock signal CK and generate a first clock signal and a second clock signal having a unit phase difference from the clock signal CK. The phase interpolation circuit 930 may generate a transmission clock signal TCK by interpolating phases of the first and second clock signals. The phase interpolation circuit 930 may include a phase mixer that generates the transmission clock signal TCK by mixing the phases of the first and second clock signals. At least one of the phase mixer circuit 100 illustrated in FIG. 1 and the phase mixer circuit 600 illustrated in FIG. 8 may be applied as at least a part of the phase interpolation circuit 930. The phase interpolation circuit 930 may additionally perform duty cycle correction. The phase interpolation circuit 930 may correct the duty cycle of the transmission clock signal TCK. The clock transmitter 940 may receive the transmission clock signal TCK from the phase interpolation circuit 930. The clock transmitter 940 may be connected to another semiconductor apparatus through a clock transmission line 901. The other semiconductor apparatus may be an external device, or may be another semiconductor chip or die provided in a single package. The clock transmitter 940 may drive the clock transmission line 901 based on the transmission clock signal TCK to transmit the transmission clock signal TCK to the other semiconductor apparatus through the clock transmission line 901.

The data latch circuit 950 may receive the internal data signal IND and sequentially store the internal data signal IND. The data latch circuit 950 may receive the plurality of divided clock signals DCK from the division circuit 920. The data latch circuit 950 may sequentially store the internal data signal IND in synchronization with the plurality of divided clock signals DCK, and sequentially output the internal data signal stored in synchronization with the plurality of divided clock signals DCK. The data latch circuit 950 may include a pipe latch circuit or a first in first out (FIFO) circuit. The serializer 960 may receive output signals of the data latch circuit 950. The serializer 960 may receive the plurality of divided clock signals DCK from the division circuit 920. The serializer 960 may further receive the transmission clock signal TCK. The serializer 960 may serialize the output signals of the data latch circuit 950 in synchronization with the plurality of divided clock signals DCK and the transmission clock signal TCK, and output the serialized signal as a transmission data signal TD. The serializer 960 may primarily align the output signals of the data latch circuit 950 in synchronization with the plurality of divided clock signals DCK. The serializer 960 may secondarily align the signals, which have been aligned in synchronization with the plurality of divided clock signals DCK, in synchronization with the transmission clock signal TCK. The serializer 960 may output the signal aligned in synchronization with the transmission clock signal TCK as the transmission data signal TD. The data transmitter 970 may be connected to the other semiconductor apparatus through a data transmission line 902. The data transmitter 970 may drive the data transmission line 902 based on the transmission data signal TD to transmit the transmission data signal TD to the other semiconductor apparatus through the data transmission line 902.

Figure 12:
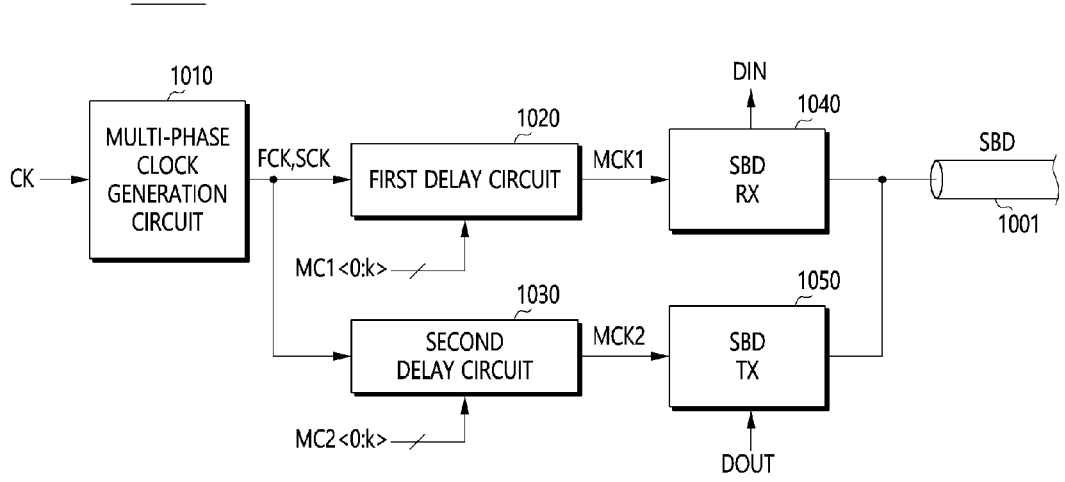
FIG. 12 is a diagram illustrating a configuration of a semiconductor apparatus in accordance with an embodiment.

FIG. 12 is a diagram illustrating the configuration of a semiconductor apparatus 1000 in accordance with an embodiment. Referring to FIG. 12, the semiconductor apparatus 1000 may transmit and receive a simultaneous bidirectional signal SBD based on a clock signal CK. The simultaneous bidirectional signal SBD may be a signal in which a data signal transmitted from the semiconductor apparatus 1000 and a data signal transmitted from another semiconductor apparatus connected to the semiconductor apparatus 1000 through a signal transmission line 1001 overlap each other. The semiconductor apparatus 1000 may be connected to the signal transmission line 1001 and may transmit and receive the simultaneous bidirectional signal SBD through the signal transmission line 1001. The semiconductor apparatus 1000 may generate the simultaneous bidirectional signal SBD based on an output data signal DOUT, and generate an input data signal DIN from the simultaneous bidirectional signal SBD. Because, in an embodiment, the simultaneous bidirectional signal SBD has a voltage level at which the data signal transmitted from the semiconductor apparatus 1000 and the data signal transmitted from the other semiconductor apparatus overlap each other, matching the transition timings of both data signals may be important.

The semiconductor apparatus 1000 may include a multiphase clock generation circuit 1010, a first delay circuit 1020, a second delay circuit 1030, a data reception circuit 1040 (SBD RX), and a data transmission circuit 1050 (SBD TX). The multi-phase clock generation circuit 1010 may receive the clock signal CK and generate a plurality of clock signals having mutually different phases from the clock signal CK. The multi-phase clock generation circuit 1010 may output two of the plurality of clock signals as a first clock signal FCK and a second clock signal SCK. The plurality of clock signals may sequentially have a phase difference corresponding to a unit phase. The first clock signal FCK may have a phase that leads the second clock signal SCK by the unit phase. The unit phase may be arbitrarily determined. The multi-phase clock generation circuit 1010 may include at least one of a delay circuit, a phase splitter, a clock division circuit, and a phase interpolator.

The first delay circuit 1020 may receive the first and second clock signals FCK and SCK, and generate a first mixed clock signal MCK1 based on the first and second clock signals FCK and SCK. The first delay circuit 1020 may generate the first mixed clock signal MCK1 by mixing phases of the first and second clock signals FCK and SCK. The first delay circuit 1020 may receive a first mixed code signal MC1<0:k>, and mix the phases of the first and second clock signals based on the first mixed code signal MC1<0: k>. Here, k may be any integer of 2 or more. At least one of the phase mixer circuit 100 illustrated in FIG. 1 and the phase mixer circuit 600 illustrated in FIG. 8 may be applied as the first delay circuit 1020. The second delay circuit 1030 may receive the first and second clock signals FCK and SCK, and generate a second mixed clock signal MCK2 based on the first and second clock signals FCK and SCK. The second delay circuit 1030 may generate the second mixed clock signal MCK2 by mixing the phases of the first and second clock signals FCK and SCK. The second delay circuit 1040 may receive a second mixed code signal MC2<0:k>, and mix the phases of the first and second clock signals FCK and SCK based on the second mixed code signal MC2<0:k>. At least one of the phase mixer circuit 100 illustrated in FIG. 1 and the phase mixer circuit 600 illustrated in FIG. 8 may be applied as the second delay circuit 1030. A value of the second mixed code signal MC2<0:k> may be the same as the value of the first mixed code signal MC1<0:k>. The first and second delay circuits 1030 and 1040 may have substantially the same configuration, and the first and second mixed clock signals MCK1 and MCK2 may have substantially the same phase. In an embodiment, the value of the second phase mixed code signal MC2<0:k> may be changed independently of the value of the first mixed code signal MC1<0:k>, and the phases of the first and second mixed clock signals MCK1 and MCK2 may be changed independently of each other.

The data reception circuit 1040 may be connected to the signal transmission line 1001, and may receive the simultaneous bidirectional signal SBD through the signal transmission line 1001. The data reception circuit 1040 may receive the first mixed clock signal MCK1 from the first delay circuit 1020. The data reception circuit 1040 may generate the input data signal DIN by sampling the simultaneous bidirectional signal SBD in synchronization with the first mixed clock signal MCK1. The data transmission circuit 1050 may receive the output data signal DOUT, and receive the second mixed clock signal MCK2 from the second delay circuit 1030. The data transmission circuit 1050 may be connected to the signal transmission line 1001. The data transmission circuit 1050 may generate the simultaneous bidirectional signal SBD by driving the signal transmission line 1001 according to the logic level of the output data signal DOUT in synchronization with the second mixed clock signal MCK2.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:

1. A phase mixer circuit comprising:
an intermediate clock generation circuit configured to receive a first input clock signal and a second input clock signal to generate an intermediate clock signal having an intermediate phase between phases of the first input clock signal and the second input clock signal; and
a mixing circuit configured to receive the first input clock signal, second input clock signal, and the intermediate clock signal to generate an output clock signal by mixing the phase of the first input clock signal and the phase of the intermediate clock signal when a target phase of the output clock signal lagging the phase of the first input clock signal is closer to the phase of the first input clock signal than the second input clock signal, and to generate the output clock signal by mixing the phase of the second input clock signal and the phase of the intermediate clock signal when the target phase leading the phase of the second input clock signal is closer to the phase of the second input clock signal than the first input clock signal.

2. The phase mixer circuit according to claim 1, wherein the intermediate clock generation circuit is configured to generate the intermediate clock signal by mixing the phase of the first input clock signal and the phase of the second input clock signal at a one-to-one ratio.

3. The phase mixer circuit according to claim 1, wherein the mixing circuit comprises:
a mixed code control circuit configured to generate an intermediate mixed code signal based on a first mixed code signal and a second mixed code signal;
a first driver circuit configured to drive the first input clock signal based on the first mixed code signal and to output a first driving signal to a mixing node;

a second driver circuit configured to drive the second input clock signal based on the second mixed code signal and to output a second driving signal to the mixing node; and a third driver circuit configured to drive the intermediate clock signal based on the intermediate mixed code signal and to output a third driving signal to the mixing node.

4. The phase mixer circuit according to claim 3, wherein, when a most significant bit of the first mixed code signal is 0, the mixed code control circuit is configured to generate the intermediate mixed code signal from the first mixed code signal, and when a least significant bit of the second mixed code signal is 1, the mixed code control circuit is configured to generate the intermediate mixed code signal from the second mixed code signal.

5. The phase mixer circuit according to claim 4, wherein, when the most significant bit of the first mixed code signal is 1 and the least significant bit of the second mixed code signal is 0, the mixed code control circuit is configured to set all of the bits of the intermediate mixed code signal to 1.

6. The phase mixer circuit according to claim 3, wherein the mixed code control circuit comprises:

a first selection circuit configured to output the first mixed code signal as a bar signal of the intermediate mixed code signal when a most significant bit of the first mixed code signal is 0, and to output a bar signal of the second mixed code signal as the bar signal of the intermediate mixed code signal when a least significant bit of the second mixed code signal is 1;

a first setting circuit configured to set bits of the bar signal of the intermediate mixed code signal to 0 when the most significant bit of the first mixed code signal is 1 and the least significant bit of the second mixed code signal is 0;

a second selection circuit configured to output a bar signal of the first mixed code signal as the intermediate mixed code signal when the most significant bit of the first mixed code signal is 0, and to output the second mixed code signal as the intermediate mixed code signal when the least significant bit of the second mixed code signal is 1; and a second setting circuit configured to set all of the bits of the intermediate mixed code signal to 1 when the most significant bit of the first mixed code signal is 1 and the least significant bit of the second mixed code signal is 0.

7. The phase mixer circuit according to claim 3, further comprising:

an output circuit configured to output the output clock signal by driving a signal of the mixing node.

8. The phase mixer circuit according to claim 1, further comprising:

a first delay circuit configured to receive the first input clock signal to delay the first input clock signal; and a second delay circuit configured to receive the second input clock signal to delay the second input clock signal, wherein delay times of the first and second delay circuits are substantially equal to time at which the intermediate clock generation circuit generates the intermediate clock signal from the first and second input clock signals, respectively.

9. A phase mixing method comprising the steps of:

receiving a first input clock signal and a second input clock signal;

generating an intermediate clock signal having an intermediate phase between phases of the first and second input clock signals;

determining a code value of a mixed code signal; and generating an output clock signal by mixing the phase of one of the first input clock signal and the second input clock signal and the phase of the intermediate clock signal based on the code value of the mixed code signal.

10. The phase mixing method according to claim 9, wherein the code value of the mixed code signal is one of first to $2n+1^{th}$ values and n is an integer of 2 or more, and wherein, when the code value of the mixed code signal is one of the first to $n^{th}$ values, the output clock signal is generated by mixing the phase of the first input clock signal and the phase of the intermediate clock signal.

11. The phase mixing method according to claim 10, wherein, when the code value of the mixed code signal is one of the $n+2^{th}$ to $2n+1^{th}$ values, the output clock signal is generated by mixing the phase of the second input clock signal and the phase of the intermediate clock signal.

12. The phase mixing method according to claim 10, wherein, when the code value of the mixed code signal is the $n+1^{th}$ value, the output clock signal is generated by driving the intermediate clock signal.

13. A phase mixer circuit comprising:

a phase clock generation circuit configured to receive a first input clock signal and a second input clock signal to generate a first phase clock signal by delaying the first input clock signal, to generate a second phase clock signal by delaying the second input clock signal, and to generate a third phase clock signal having an intermediate phase between phases of the first and second phase clock signals; and a mixing circuit configured to generate an output clock signal by mixing the phase of the first phase clock signal and the phase of the third phase clock signal when code values of a mixed code signal are first to $n^{th}$ values, to generate the output clock signal by driving the third phase clock signal when the code value of the mixed code signal is an $n+1^{th}$ value, and to generate the output clock signal by mixing the phase of the second phase clock signal and the phase of the third phase clock signal when the code values of the mixed code signal are $n+2^{th}$ to $2n+1^{th}$ values, wherein n is an integer of 2 or more.

14. The phase mixer circuit according to claim 13, wherein the phase clock generation circuit comprises:

a first delay circuit configured to generate a first delayed clock signal by delaying the first input clock signal;

a second delay circuit configured to generate a second delayed clock signal by delaying the second input clock signal;

a third delay circuit configured to generate the first phase clock signal by delaying the first delayed clock signal;

a fourth delay circuit configured to generate the second phase clock signal by delaying the second delayed clock signal; and an intermediate clock generation circuit configured to generate the third phase clock signal by mixing phases of the first and second delayed clock signals at a one-to-one ratio.

15. The phase mixer circuit according to claim 14, wherein the first delay circuit delays the first input clock signal by a first time and the second delay circuit delays the second input clock signal by the first time.

16. The phase mixer circuit according to claim 14, wherein the third delay circuit delays the first delayed clock signal by a second time, the fourth delay circuit delays the second delayed clock signal by the second time, and the second time is substantially equal to a time at which the intermediate clock generation circuit generates the third phase clock signal from the first and second delayed clock signals.

17. The phase mixer circuit according to claim 13, wherein the mixed code signal includes first to $2n^{th}$ bits, and the mixing circuit comprises:

a mixed code control circuit configured to generate an intermediate mixed code signal based on the mixed code signal;

a first driver circuit configured to output a first driving signal to a mixing node by driving the first phase clock signal based on the first to nth bits of the mixed code signal;

a second driver circuit configured to output a second driving signal to the mixing node by driving the second phase clock signal based on the $n+1^{th}$ to $2n^{th}$ bits of the mixed code signal; and a third driver circuit configured to output a third driving signal to the mixing node by driving the third phase clock signal based on the intermediate mixed code signal.

18. The phase mixer circuit according to claim 17, wherein, when the nth bit of the mixed code signal is 0, the mixed code control circuit generates the intermediate mixed code signal based on the first to nth bits of the mixed code signal, and when the $n+1^{th}$ bit of the mixed code signal is 1, the mixed code control circuit generates the intermediate mixed code signal based on the $n+1^{th}$ to $2n^{th}$ bits of the mixed code signal.

19. The phase mixer circuit according to claim 18, wherein, when the $n^{th}$ bit of the mixed code signal is 1 and the $n+1^{th}$ bit of the mixed code signal is 0, the mixed code control circuit sets all of the bits of the intermediate mixed code signal to 1.

20. The phase mixer circuit according to claim 17, further comprising:

an output circuit configured to output the output clock signal by driving a signal of the mixing node.

21. The phase mixer circuit according to claim 13, wherein the mixed code signal includes first to $2n^{th}$ bits, and the mixed code control circuit comprises:

a first selection circuit configured to output the first to $n^{th}$ bits of the mixed code signal as a bar signal of the intermediate mixed code signal when the nth bit of the mixed code signal is 0, and to output $n+1^{th}$ to $2n^{th}$ bits of a bar signal of the mixed code signal as the bar signal of the intermediate mixed code signal when the $n+1^{th}$ bit of the mixed code signal is 1;

a first setting circuit configured to set bits of the bar signal of the intermediate mixed code signal to 0 when the $n^{th}$ bit of the mixed code signal is 1and the $n+1^{th}$ bit of the mixed code signal is 0;

a second selection circuit configured to output first to $n^{th}$ bits of the bar signal of the mixed code signal as the intermediate mixed code signal when the $n^{th}$ bit of the mixed code signal is 0, and to output the $n+1^{th}$ to $2n^{th}$ bits of the mixed code signal as the intermediate mixed code signal when the $n+1^{th}$ bit of the mixed code signal is 1; and a second setting circuit configured to set bits of the intermediate mixed code signal to 1 when the nth bit of the mixed code signal is 1 and the $n+1^{th}$ bit of the mixed code signal is 0.

\* \* \* \* \*